WITNESSES:
Bernard R. Giegue
James F. Young

INVENTOR
Leonard C. Vercellotti
BY E. F. Possessky
ATTORNEY

United States Patent Office 3,337,816
Patented Aug. 22, 1967

3,337,816
GATED UNIJUNCTION TRANSISTOR OSCILLATOR HAVING IMPROVED PERIODICITY

Leonard C. Vercellotti, Penn Hills, Verona, Pa., assignor to Westinghouse Electric Corporation, Pittsburgh, Pa., a corporation of Pennsylvania Filed Mar. 25, 1966, Ser. No. 537,529
10 Claims. (Cl. 331—111)

Figure 1:
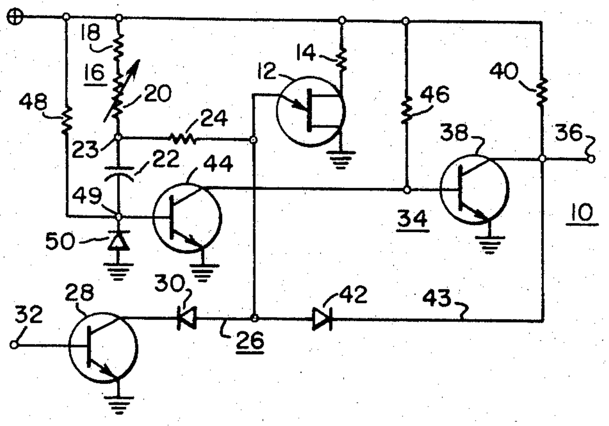

The present invention relates to oscillator circuits and more particularly to gated unijunction transistor oscillators.

In a unijunction transistor relaxation oscillator, the unijunction emitter voltage is repeatedly caused to rise to a critical value equal to the intrinsic standoff ratio times the unijunction interbase voltage plus the internal diode drop of the unijunction. Each time the critical emitter voltage is reached, the unijunction transistor is fired since the emitter PN junction is then forward biased. After each firing, emitter current flows until the characteristic turn-off valley point is reached. A resistor capacitor timing circuit is normally used to determine the emitter voltage rise rate and thereby operates as a primary determinant of the frequency of relaxation oscillations.

In a gated unijunction transistor oscillator, critical capacitor voltage is withheld from the unijunction transistor emitter by suitable means such as a switchable bypass path across the capacitor. Use is made of gated unijunction transistor oscillators where it is desired to control the turn on time of a unijunction transistor of the oscillator for purposes such as synchronized coupling between separate asynchronous systems.

To assure substantially equal time spans between successive unijunction transistor firings, it is necessary that the timing capacitor voltage be the same at the start of successive oscillator cycles. Typically, the capacitor voltage in a gated unijunction transistor oscillator is caused to have a substantially different starting value when the oscillator is first gated as compared to the starting capacitor voltage value at the beginning of the second and subsequent cycles in the same gated period of operation. The reason for the difference is that the gating circuit parameters which determine the initial capacitor starting voltage substantially differ from the circuit operating parameters which determine the starting capacitor voltage at the beginning of successive cycles in the same operating period. Incremental changes in the starting capacitor voltage also typically occur after the second cycle, but these changes are relatively small as compared to the initial change in starting capacitor voltage.

The voltage rise time for the first oscillator pulse and the average voltage rise time for the second and successive oscillator pulses can differ to a substantial and undesirable or unacceptable extent. For example, one application of a gated unijunction transistor oscillator is in an interfacing circuit between a teletypewriter and a computer as described in a copending application entitled "Improved Interface System for Digital Computers and Serially Operated Input and Output Devices," Ser. No. 537,522, filed by L. C. Vercellotti and R. J. Madden on Mar. 25, 1966, and assigned to the present assignee. Briefly, in that application, typewriter tape or print characters are coded into or from serial binary words having the standard ASCII eight bit length at a processing rate of ten words per second while the computer operates at a much faster rate. An interfacing circuit provides serial to parallel data conversion and parallel to serial data conversion in order to transfer data between the asynchronous systems. A gated oscillator is turned on each time the teletypewriter sends or receives a word and thereby clocks the interface circuit operation synchronously with the teletypewriter bit processing rate. Excessive changes in oscillator periodicity during the oscillator on time can produce unacceptable faults in the data transfer process.

In accordance with the broad principles of the present invention, a gated unijunction transistor oscillator comprises a unijunction transistor and a resistor capacitor timing circuit coupled to the unijunction transistor emitter terminal. A gating circuit is connected in a capacitor bypass path to control oscillator startup. When the oscillator is started, capacitor voltage is cyclically raised and lowered to fire the unijunction transistor repeatedly. Capacitor discharge current is conducted through the unijunction transistor in each firing cycle until valley point or cutoff conditions are reached. Means are provided for drawing additional capacitor discharge current in each firing cycle until the cycle termination capacitor voltage substantially equals the initial starting capacitor voltage. The time for capacitor voltage buildup to the peak value is thus substantially equal in the first and subsequent cycles to provide improved periodicity of operation.

It is therefore an object of the invention to provide a novel gated unijunction transistor oscillator which is characterized with improved accuracy and improved utility.

Another object of the invention is to provide a novel gated unijunction transistor oscillator which is characterized with improved periodicity.

A further object of the invention is to provide a novel gated unijunction transistor oscillator wherein the time span of the initial cycle following gating is substantially identical with the time spans of subsequent cycles in the same gating period.

Figure 2:
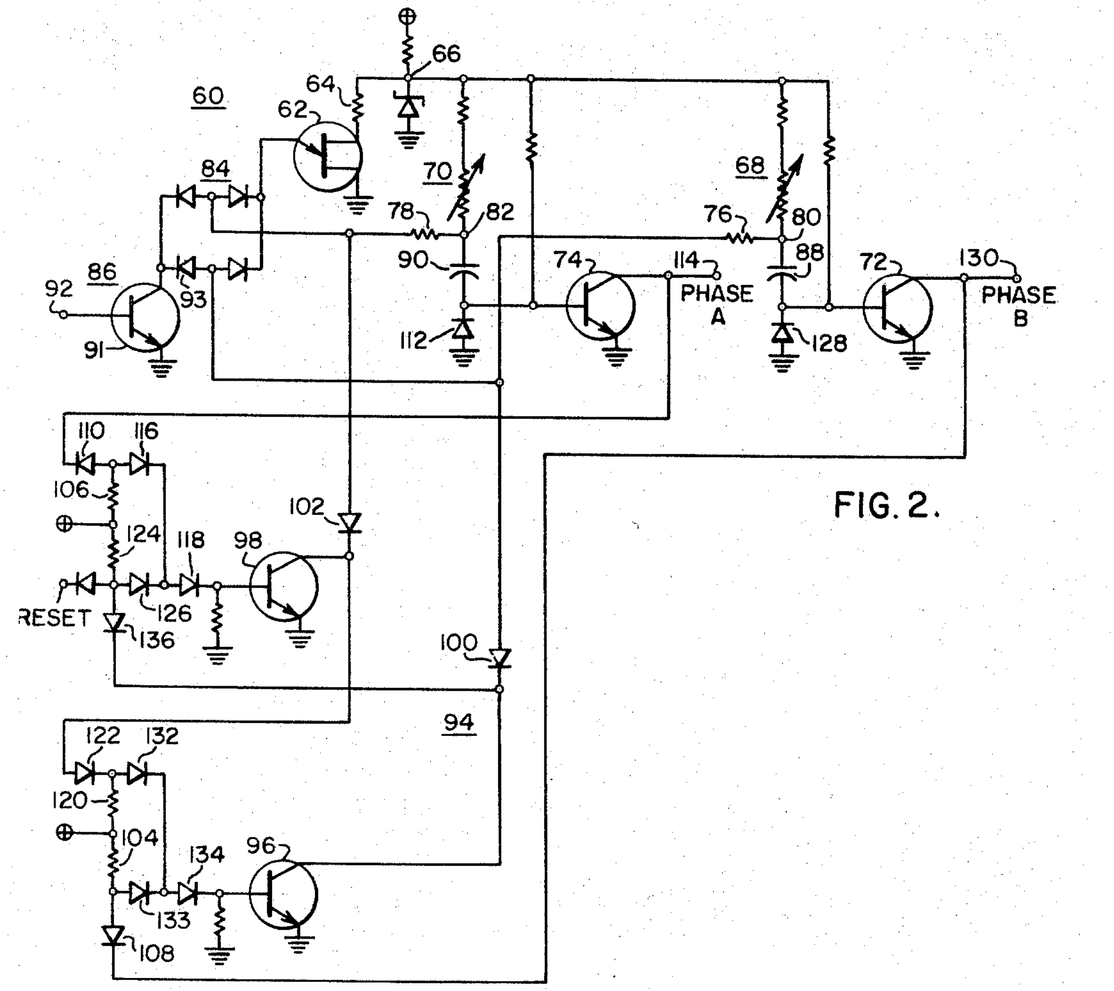

These and other objects of the invention will become more apparent upon consideration of the following detailed description along with the attached drawing, in which:

FIGURE 1 shows a schematic diagram of a gated unijunction transistor oscillator circuit arranged in accordance with the principles of the invention; and FIG. 2 shows a schematic diagram of another embodiment of the invention in the form of a two phase gated unijunction transistor oscillator.

More specifically, there is shown in FIG. 1 a gated unijunction transistor oscillator circuit 10 having a unijunction transistor 12 with one base terminal connected to a common junction and with interbase voltage supplied through a resistor 14 from a suitable DC voltage source. A timing circuit 16 is also energized by the DC source, and it includes a fixed resistor 18 and a variable resistor 20 connected in a series path with a timing capacitor 22.

Capacitor voltage is coupled to the emitter terminal of the unijunction transistor 12 through a resistor 24. The unijunction transistor 12 and its associated circuitry produces relaxation oscillations in accordance with operating theory well known in the pertaining art. A predetermined frequency of operation is accordingly determined by suitable preselection of component parameters and operating voltage. For example, the oscillator 10 can be arranged to generate output pulses at the rate of one every 9.09 milliseconds which corresponds to the standard teletypewriter bit processing rate.

Oscillator turn on and turn off are controlled by a gating circuit 26 which in this instance includes a transistor 28 coupled to the unijunction transistor emitter terminal through a current directing diode 30. A signal is normally applied to gating input terminal 32 to hold the transistor 28 in a conductive state and prevent the unijunction transistor emitter voltage from reaching the critical value. When the input signal is removed from the gating terminal 32, the gating transistor 28 becomes nonconductive and the unijunction transistor emitter voltage is controlled by the voltage across the capacitor 22.

When the gating transistor switch 28 is switched off, the starting voltage across the capacitor 22 for the initial cycle of oscillator operation is dependent upon the previous operating voltage drop across the diode 30 and the transistor 28. In turn, the time for the capacitor voltage 22 to rise to the point where the unijunction transistor 12 is fired depends on the initial starting voltage on the capacitor 22. If the starting voltage across the capacitor 22 at the beginning of subsequent operating cycles in the same operating period differs materially from the initial capacitor starting voltage, a substantial difference is caused in the time span of the initial oscillator cycle and subsequent cycles. As indicated previously, small differences can exist among the time spans of oscillator cycles subsequent to the first cycle, but such differences are negligible in many applications including the aforementioned teletypewriter interfacing application.

A circuit 34 becomes operative each time the unijunction transistor 12 is fired to assure substantial uniformity of starting capacitor voltage in all oscillator operating cycles and to produce an output pulse at an output terminal 36 in each operating cycle. The circuit 34 includes a grounded emitter transistor 38 having collector voltage supplied through a resistor 40. The collector terminal of the transistor 38 corresponds to the output terminal 36 and is coupled to the unijunction transistor emitter terminal through a current directing diode 42 to form a normally nonconductive capacitor discharge circuit 43.

Another grounded emitter transistor 44 is included in the circuit 34, and its collector is coupled to the base terminal of the transistor 38 and supplied with voltage through a resistor 46. Base-emitter bias current is supplied through a resistor 48 normally to hold the transistor 44 in a conductive state. A back connected diode 50 is coupled between the base terminal of the transistor 44 and the common or ground junction to support forward bias voltage across the base-emitter PN junction. The timing circuit 16 and in particular the negative plate of the capacitor 22 is connected to the base terminal of the transistor 44 to complete a circuit loop with the voltage supply for capacitor charging current flow when the transistor 44 is in a conductive state.

After oscillator startup by operation of the gating circuit 26, the voltage across the capacitor 22 rises from the initial starting value until the peak unijunction transistor emitter voltage is reached at the unijunction transistor emitter terminal. The unijunction transistor 12 is then fired to begin discharging the capacitor 22 through discharge loop circuitry including the diode 50. Forward bias across the diode 50 immediately causes the transistor 44 to become nonconductive to apply a forward bias across the base emitter PN junction of the transistor 38 and switch it to a conductive state. An output signal is thereby developed at the output terminal 36, and another discharge path is provided for the capacitor 22 through the diode 42 and the transistor 38 and the diode 50 in the circuit 43.

The capacitor 22 stops discharging when the capacitor voltage reaches an equilibrium value. At that operating time point, the potential at capacitor junction 23 has a value substantially equal to its initial value as determined by the voltage drops across the resistor 24 and the diode 42 and by the collector-emitter drop of the transistor 38. The transistor 44 is then returned to a conductive state since the potential at junction 49 rises to a value which causes the transistor 44 to become forward biased again. In turn, the transistor 38 is switched to a nonconductive state. Charging current accordingly is supplied to the capacitor 22 from the voltage supply and a new cycle is begun. Cyclical operation continues until the gating circuit 26 is operated to bypass the timing capacitor 22.

The resistor 24 is common to the gating path and the post gating discharge path through the transistor 38. Thus, the initial starting voltage for the capacitor 22 in the first oscillator operating cycle is determined essentially by the voltage drop characteristics of the gating diode 30 and the gating transistor 28. Similarly, the capacitor starting voltage at the beginning of all subsequent cycles in a gated oscillator operating period is essentially determined by the voltage drop characteristics of the discharge diode 42 and the discharge transistor 38.

With the use of substantially identical types of diodes and transistors in the capacitor discharge path of the gating circuit 26 and the circuit 34, starting voltage across the capacitor 22 is substantially uniform in the first cycle and subsequent cycles of oscillator operation. The characteristic valley point condition which terminates conduction of the unijunction transistor 12 may occur at any point in the conduction time period of the discharge transistor 38 substantially without causing the starting capacitor voltage for the next operating cycle to be different from the initial starting capacitor voltage value.

As a result of the control placed on the starting capacitor voltage value from cycle to cycle of operation, the time for the first oscillator pulse to be generated is substantially equal to the time span between successive oscillator pulses. The circuit 10 thus operates with improved periodicity. Substantially identical results can be achieved with modifications of the circuit 10, for example by the use of switches other than transistors in the capacitor discharge paths of the circuits 26 and 34.

In FIG. 2, there is shown another embodiment of the invention in the form of a two phase unijunction transistor oscillator circuit 60. It includes a unijunction transistor 62 supplied with interbase voltage through a resistor 64 from a Zener diode regulated supply junction 66. Respective timing circuits 68 and 70 are connected to the supply junction 66 and alternately operated in controlling the emitter voltage of the unijunction transistor 62.

Respective transistor switches 72 and 74 are coupled to the voltage supply junction 66 and the timing circuits 68 and 70 in a manner similar to that described for the embodiment of FIG. 1. Coupling is provided for the timing circuits 68 and 70 to the unijunction transistor emitter junction by means of respective resistors 76 and 78 which are connected between capacitor junctions 80 and 82 and the unijunction transistor emitter through a diode OR circuit 84.

A gating circuit 86 prevents capacitors 88 and 90 in the two timing circuits from operating the unijunction transistor 62 when a signal is applied to input terminal 92. With removal of the signal from the terminal 92, one of the two timing circuits 68 and 70 will begin its timed operation as determined by the state of a flip flop circuit 94.

In this instance, the flip flop circuit 94 includes a transistor 96 and a transistor 98 having collector terminals respectively coupled to the resistors 76 and 78 through diodes 100 and 102. When the oscillator 60 is first started by operation of the gating circuit 86, the flip flop transistor 98 is nonconductive and the transistor 96 is conductive. Accordingly, voltage rises on the timing capacitor 90 while the voltage level across the timing capacitor 88 remains substantially constant at its initial value. Both transistor switches 72 and 74 are conductive with collector current supplied by the voltage source through respective resistors 104 and 106 and respective diodes 108 and 110.

When the voltage across the timing capacitor 90 is sufficient to develop the peak unijunction transistor emitter voltage through the diode OR circuit 84, the unijunction transistor 62 is fired and the capacitor 90 discharges through the unijunction transistor 62 and base-emitter diode 112 thereby causing the transistor 74 to be switched off. At the same time, the collector voltage developed at a junction 114 develops a back voltage across the diode 110 so that drive current is supplied through diodes 116 and 118 to the flip flop transistor 98.

As the transistor 98 becomes conductive, base drive current previously provided through a supply resistor 120 and diodes 132 and 134 is diverted from the other flip flop transistor 96 by current flow through a cross connected diode 122. The transistor 96 accordingly becomes nonconductive and causes voltage to begin rising on the timing capacitor 88. With the relatively fast switching characteristics of commercially available transistors, the transistor 74 and the flip flop transistor 96 become nonconductive and the flip flop transistor 98 becomes conductive at substantially the same time that the timing capacitor 90 begins to discharge.

The flip flop transistor 98 continues to conduct timing capacitor discharge current until the initial starting capacitor voltage is reached irrespectively of the point in time at which the valley point condition occurs in the unijunction transistor 62 to restore it to a nonconductive state. As in the case of FIG. 1, discharge current from the capacitor 90 stops when the capacitor voltage level has dropped to the initial starting value because the impedance of the diode 102 and the transistor 98 in the discharge path is substantially identical with that of a diode 93 and a transistor 91 in the gating circuit path.

Since the base emitter junction of the transistor 74 is then forward biased, the transistor 74 is switched to a conductive state. Current again flows from the voltage source through the resistor 106 and the diode 110 and through the transistor 74. The flip flop transistor 98 remains in a conductive state with drive current supply from the voltage source through a resistor 124 and diodes 126 and 118. With the flip flop transistor 96 in a continuing nonconductive state during the continuing second cycle of oscillator operation, voltage continues to rise across the timing capacitor 88 of the other timing circuit 68.

As in the case of the first oscillator cycle, the unijunction transistor 62 is fired when the voltage across the capacitor 88 reaches the value required to produce the peak unijunction transistor emitter voltage. The timing capacitor 88 then begins to discharge causing the normally conducting transistor 72 to be turned off by a forward voltage developed across base-emitter diode 128. The resultant increase in voltage at junction 130 produces a back voltage across the diode 108 thereby diverting base drive current to the transistor 96 through diodes 133 and 134. As the flip flop transistor 96 becomes conductive, base drive current is diverted from the flip flop transistor 98 through a cross connected diode 136. The flip flop transistor 98 then becomes nonconductive to allow the timing circuit 70 to begin operation for the third oscillator cycle.

The timing capacitor 88 in the timing circuit 68 continues to discharge through the flip flop transistor 96 until the initial starting value of capacitor voltage is reached as described in connection with the capacitor discharge functioning of the flip flop transistor 98. With the cessation of discharge current from the timing capacitor 88, the base-emitter junction of the transistor 72 again becomes forward biased and the transistor 72 returns to its normally conductive state to draw current from the supply resistor 104 and through the diode 108.

When the timing capacitor 90 reaches the critical voltage in the third cycle of operation, the flip flop transistor 98 is operated as previously described. The oscillator circuit 60 thus operates repeatedly in the manner described until the gating circuit 86 is actuated to provide a bypass path across the timing capacitors 88 and 90.

The junctions 114 and 130 accordingly can be provided as output terminals to generate respectively a phase A output and a phase B output for the oscillator 60. Thus, pulses are generated as physically separate outputs at the junctions 114 and 130 at different points in time. Since the timing capacitor 90 is always returned to a voltage value substantially equal to its initial starting voltage value, the time required for a pulse to be generated at the junction 114 in the first phase A operating cycle is substantially equal to the time required for pulses to be generated at the junction 114 in subsequent phase A cycles. Similarly, pulses at the output junction 130 are generated after substantially equal amounts of time in successive phase B cycles. With substantially equal parameters in the timing circuits 68 and 70, the phase A and phase B pulses from the output terminals 114 and 130 can be generated alternately with substantially equal time between successive and alternate pulses. Improved periodicity is thus separately and jointly provided in the phase outputs of the two phase oscillator 60.

The foregoing description has been presented only to illustrate the principles of the invention. Accordingly, it is desired that the invention be not limited by the embodiments described, but, rather, that it be accorded an interpretation consistent with the scope and spirit of its broad principles.

What is claimed is:

1. A gated unijunction transistor oscillator energizable by a suitable voltage source, said oscillator comprising a unijunction transistor and a resistive capacitive timing circuit having a timing capacitor coupled between the unijunction transistor emitter terminal and a common junction, a gating circuit connected in a capacitor bypass path to the common junction to hold said capacitor at a predetermined starting voltage during bypass gating operation, a normally nonconductive bypass circuit having voltage drop characteristics substantially identical to those of said gating circuit and providing another capacitor bypass path to the common junction, and means for operating said bypass circuit to carry capacitor discharge current until the capacitor voltage substantially reaches the predetermined starting voltage following each firing of said unijunction transistor.

2. A gated unijunction transistor oscillator as set forth in claim 1 wherein said operating means includes a normally conductive transistor for producing a bypass circuit control voltage, and a diode reverse connected in the transistor base-emitter loop and connected in a loop which carries capacitor discharge current.

3. A gated unijunction transistor oscillator as set forth in claim 1 wherein said gating circuit includes a gating transistor connected in series with a diode, said diode coupled to said capacitor, and said bypass circuit includes a transistor connected in series with a diode coupled to said capacitor.

4. A gated unijunction transistor oscillator as set forth in claim 3 wherein said operating means includes a normally conductive transistor for producing a control voltage to operate said bypass circuit transistor, and a diode reverse connected in the normally conductive control transistor base-emitter loop and connected in a loop which carries capacitor discharge current.

5. A two phase gated unijunction transistor oscillator as set forth in claim 1 wherein another resistive capacitive timing circuit having another timing capacitor is coupled between the unijunction transistor emitter terminal and the common junction, said gating circuit is connected in a capacitor bypass path across each of said capacitors to hold said capacitors at respective predetermined starting voltage levels, another nonconductive bypass path having voltage drop characteristics substantially identical to those of said gating circuit and providing another capacitor bypass path for said other timing capacitor, and means for alternately operating said bypass circuits as said unijunction transistor is successively fired so as to carry capacitor discharge current from the associated timing capacitor until its voltage level reaches the starting voltage level predetermined for it.

6. A two phase gated unijunction transistor oscillator as set forth in claim 5 wherein a diode OR circuit is connected in the coupling between said capacitors and said unijunction transistor emitter terminal.

7. A two phase gated unijunction transistor oscillator as set forth in claim 5 wherein said gating circuit includes a gating transistor, and a diode OR circuit coupled between said gating transistor and said capacitors.

8. A two phase gated unijunction transistor oscillator as set forth in claim 5 wherein said operating means includes a normally conductive transistor associated with each timing circuit to produce a control voltage for operating the associated bypass circuit, and a diode reverse connected in the base-emitter loop of each transistor and connected in a loop which carries discharge current for the associated capacitor.

9. A two phase gated unijunction transistor oscillator as set forth in claim 7 wherein there is included a flip flop circuit having respective transistors, and respective diodes connected in series with said transistors in said bypass circuits.

10. A two phase gated unijunction transistor oscillator as set forth in claim 9 wherein said operating means includes a normally conductive transistor associated with each timing circuit to produce a control voltage for operating said flip flop circuit, a diode reverse connected in each transistor base-emitter loop and connected in a loop which carries discharge current for the associated capacitor, and each of said timing circuits having substantially equal oscillator frequency determining parameters and equal predetermined starting capacitor voltage levels.

References Cited

UNITED STATES PATENTS

| | | | |
|---|---|---|---|
| 3,158,822 | 11/1964 | Brechling ---------- | 331—111 |
| 3,289,104 | 11/1966 | McClay et al. -------- | 331—111 |

ROY LAKE, *Primary Examiner.*

S. H. GRIMM, *Assistant Examiner.*